United States Patent
Ali et al.

(10) Patent No.: US 8,115,321 B2
(45) Date of Patent: Feb. 14, 2012

(54) SEPARATE PROBE AND BOND REGIONS OF AN INTEGRATED CIRCUIT

(75) Inventors: Anwar Ali, San Jose, CA (US); Kalyan Doddapaneni, Milpitas, CA (US); Gokulnath Sulur, Sunnyvale, CA (US); Wilson Leung, San Francisco, CA (US); Tauman T Lau, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/432,763

(22) Filed: Apr. 30, 2009

(65) Prior Publication Data

US 2010/0276816 A1    Nov. 4, 2010

(51) Int. Cl.
H01L 23/485    (2006.01)
H01L 21/768    (2006.01)

(52) U.S. Cl. ............ 257/782; 257/E23.02; 257/E21.59; 257/786; 257/784; 257/775; 257/776; 257/774; 257/773

(58) Field of Classification Search .................. 257/782, 257/E23.02, E21.59, 786, 784, 775, 776, 257/774, 773; 438/612
See application file for complete search history.

(56) References Cited

U.S. PATENT DOCUMENTS

| | | | | |
|---|---|---|---|---|
| 5,155,065 A * | 10/1992 | Schweiss | | 438/599 |
| 5,506,499 A * | 4/1996 | Puar | | 324/158.1 |
| 5,801,406 A * | 9/1998 | Lubow et al. | | 257/202 |
| 6,194,235 B1 * | 2/2001 | Ma | | 438/14 |
| 6,836,026 B1 * | 12/2004 | Ali et al. | | 257/786 |
| 7,091,613 B1 | 8/2006 | Long et al. | | |
| 7,190,593 B2 * | 3/2007 | Aiki et al. | | 361/767 |
| 7,271,013 B2 * | 9/2007 | Yong et al. | | 438/14 |
| 7,687,900 B2 * | 3/2010 | Fukamizu et al. | | 257/690 |
| 2002/0017729 A1 * | 2/2002 | Macpherson | | 257/784 |
| 2004/0069988 A1 | 4/2004 | Lin et al. | | |
| 2005/0040539 A1 | 2/2005 | Carlsgaard | | |
| 2005/0151265 A1 | 7/2005 | Yang et al. | | |
| 2005/0205988 A1 | 9/2005 | Radza | | |
| 2007/0111376 A1 * | 5/2007 | Pendse | | 438/106 |
| 2007/0262425 A1 * | 11/2007 | Seko | | 257/668 |
| 2008/0036037 A1 * | 2/2008 | Woo et al. | | 257/546 |
| 2008/0061319 A1 * | 3/2008 | Madhani et al. | | 257/203 |
| 2008/0128741 A1 * | 6/2008 | Li et al. | | 257/99 |
| 2010/0140814 A1 * | 6/2010 | Jones et al. | | 257/786 |
| 2010/0295043 A1 * | 11/2010 | Yasumura et al. | | 257/48 |

FOREIGN PATENT DOCUMENTS

EP    1460690 A1    9/2004
JP    2005-85787    *    3/2005

* cited by examiner

Primary Examiner — A O Williams
(74) Attorney, Agent, or Firm — Raj Abhyanker, P.C.

(57) ABSTRACT

An integrated circuit includes a number of probe pads arranged in a staggered manner in a core region of the integrated circuit and a number of bond pads in an Input/Output (I/O) region surrounding the core region. The core region includes logic circuitry therein, and the I/O region is configured to enable the core region to communicate with one or more external circuit(s) through the number of bond pads. The integrated circuit also includes a die metal interconnect separating a bond pad area in the I/O region from a probe pad area in the core region. A dimension of the die metal interconnect and/or a position of the die metal interconnect between the probe pad area and the bond pad area is variable.

20 Claims, 10 Drawing Sheets

SEPARATE PROBE AND BOND REGIONS OF AN INTEGRATED CIRCUIT

FIELD OF TECHNOLOGY

This disclosure relates generally to the packaging technology of semiconductors and more particularly to a system and method of separate probe and bond regions of an integrated circuit.

BACKGROUND

An integrated circuit (IC) die may have a number of (Input/Output) I/O cells disposed about its periphery, each I/O cell having an I/O bonding pad. As assembly technologies improve, bond pads may be placed closer to each other (e.g., at tighter pitches). At tighter pitches, the pad structure (e.g., surface area of each I/O bond pad) may need to be smaller. This can drive a need for narrower bond wire diameters. Unfortunately, the bond pad surface may not be planer because of damage caused by wafer probing during testing of the IC die. As such, smaller diameter bond wires may not properly adhere to bond pads. This can cause a failure of the IC.

SUMMARY

Disclosed are a system and method of separate probe and bond regions of an integrated circuit. In one aspect, an integrated circuit includes a core region having a logic circuitry, an I/O region communicately coupled to the core region to enable the core region to communicate with other circuits, and a die metal interconnect separating a bond pad area in the I/O region from a probe pad area outside the I/O region of the integrated circuit. The die metal interconnect may have a length that is greater than the bond pad area length and/or the probe pad area length. Also, the die metal interconnect may have a width that is less than the bond pad area width and/or the probe pad area width.

The die metal interconnect may be a variable length die metal interconnect sized based on a circuit design requirement, and in which a cost of assembly of the integrated circuit is reduced by separating the bond pad area from the probe pad area through the die metal interconnect. A pitch between adjacent bond pad areas may reduce by at least 12% as compared to when the bond pad area and the probe pad area is the same area. An in-front staggering technique may be used at a die corner of the integrated circuit to maintain the bond pad area in the I/O region. In addition, a side staggering technique may be used at the die corner of the integrated circuit to maintain the bond pad area in the I/O region.

In another aspect, a method is disclosed. The method may include forming a die metal interconnect, forming a bond pad area in an I/O region of an integrated circuit, forming a probe pad area outside the I/O region of the integrated circuit, separating the bond pad area from the probe pad area through the die metal interconnect, and enabling a core region having a logic circuitry to communicate with at least one other circuit through the bond pad area in the I/O region adjacent to the core region. A cost of assembly of the integrated circuit may be reduced by the separating of the bond pad area from the probe pad area through the die metal interconnect. A quantity of gold required in creating a bond wire that couples the bond pad area with the package may be reduced by separating the bond pad area from the probe pad area through the die metal interconnect.

In yet another aspect, a method includes forming a die metal interconnect, forming a bond pad area in an I/O region of an integrated circuit, forming a probe pad area outside the I/O region of the integrated circuit, separating the bond pad area from the probe pad area through the die metal interconnect, and in which an in-front staggering technique is used at a die corner of the integrated circuit to maintain the bond pad area in the I/O region, and wherein a side staggering technique is used at the die corner of the integrated circuit to maintain the bond pad area in the I/O region.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other aspects and example embodiments are provided in the Drawings and the Detailed Description that follows.

BRIEF DESCRIPTION OF THE VIEWS OF DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Disclosed are a system and method of separate probe and bond regions of an integrated circuit.

Although the present embodiments have been described with reference to specific example embodiments, it will be evident that various modifications and changes may be made to these embodiments without departing from the broader spirit and scope of the various embodiments.

Figure 1:
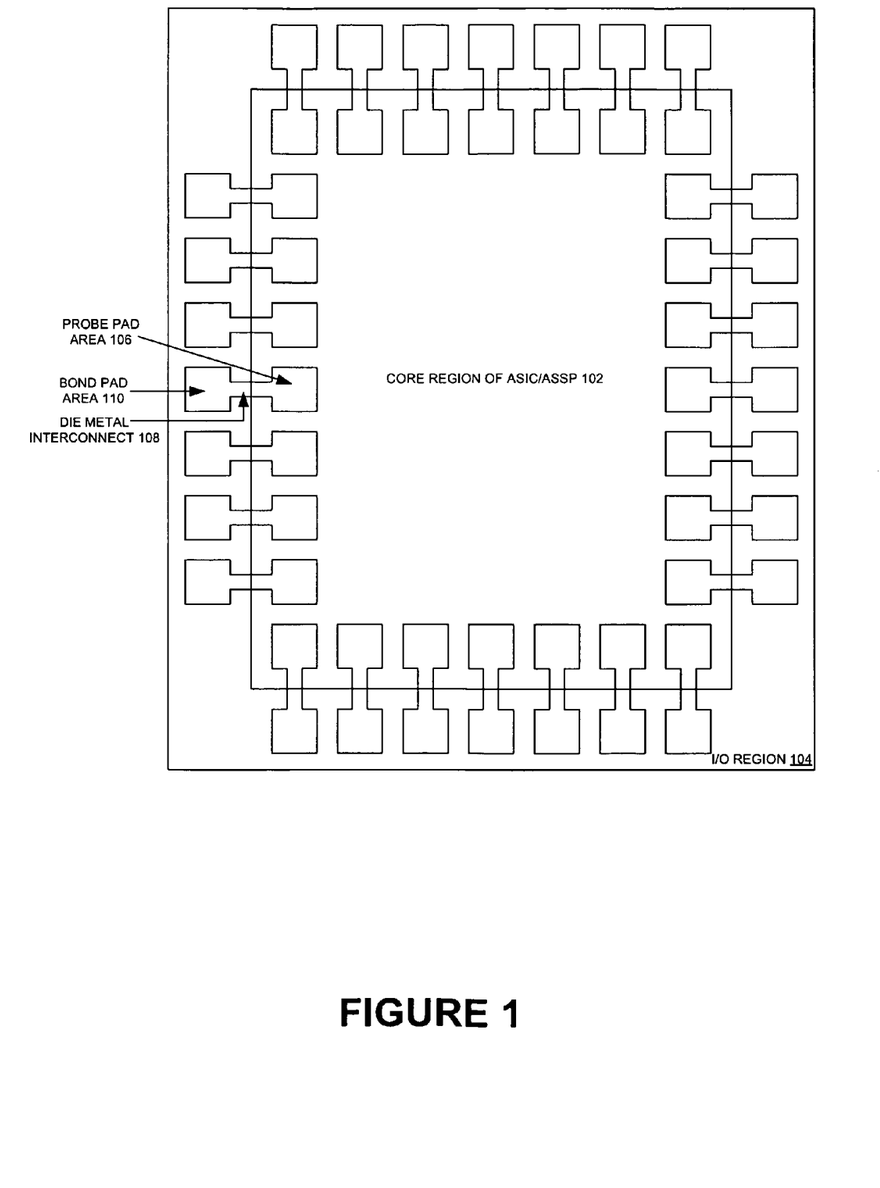
FIG. 1 is a plan view of an Integrated Circuit (IC) package illustrating the core region of ASIC/ASSP environment, according to one embodiment.

FIG. 1 is a plan view of an Integrated Circuit (IC) package illustrating the core region of application specific integrated circuit (ASIC) or application specific standard product (ASSP) environment. In particular, FIG. 1 illustrates a core region of ASIC/ASSP 102, an I/O region 104, a probe pad area 106, a die metal interconnect 108 and a bond pad area 110.

The term IC used herein may refer to a logic device such as ASIC or ASSP. In addition, an IC may include any IC in which I/O devices are placed around and near the die periphery with a die metal interconnect 108. The I/O region 104 may be used to refer to a region of an IC in which I/O devices are placed. The I/O region 104 may be arranged around the die perimeter, and may surround the core region. The term I/O device may refer to an input and/or output device that is used to interface core logic with the external IC environment. A core region of ASIC or ASSP 102 may be used herein to refer to a region of an IC where core logic, standard non I/O devices, and macros are placed. The core region of ASIC or ASSP 102 may occupy a majority of the die area with the exception of the I/O region 104. The core region may also be referred to as a core area.

A bond pad area 110 may be formed in an I/O region 104 of an IC. And a probe pad area 106 may be formed outside the I/O region 104 of an IC in the core region 102 thereof. The separation of the bond pad area 110 and the probe pad area 106 may be done through a die metal interconnect 108. The bond pad area 110 may be defined as a site on a die for bonding wire or flip chip attachment to a package. In addition, the term pad wire may refer to a wire that is used to connect a bond pad to an I/O device. A pad wire may be formed using metal routing layers of a semiconductor design. The bond pad may be a signal pad and/or power pad. A signal pad is a bond pad used for signals connecting to I/O devices. A power pad is a bond pad used for power supply. The I/O count may be the space required by I/O cells.

Figure 2A:
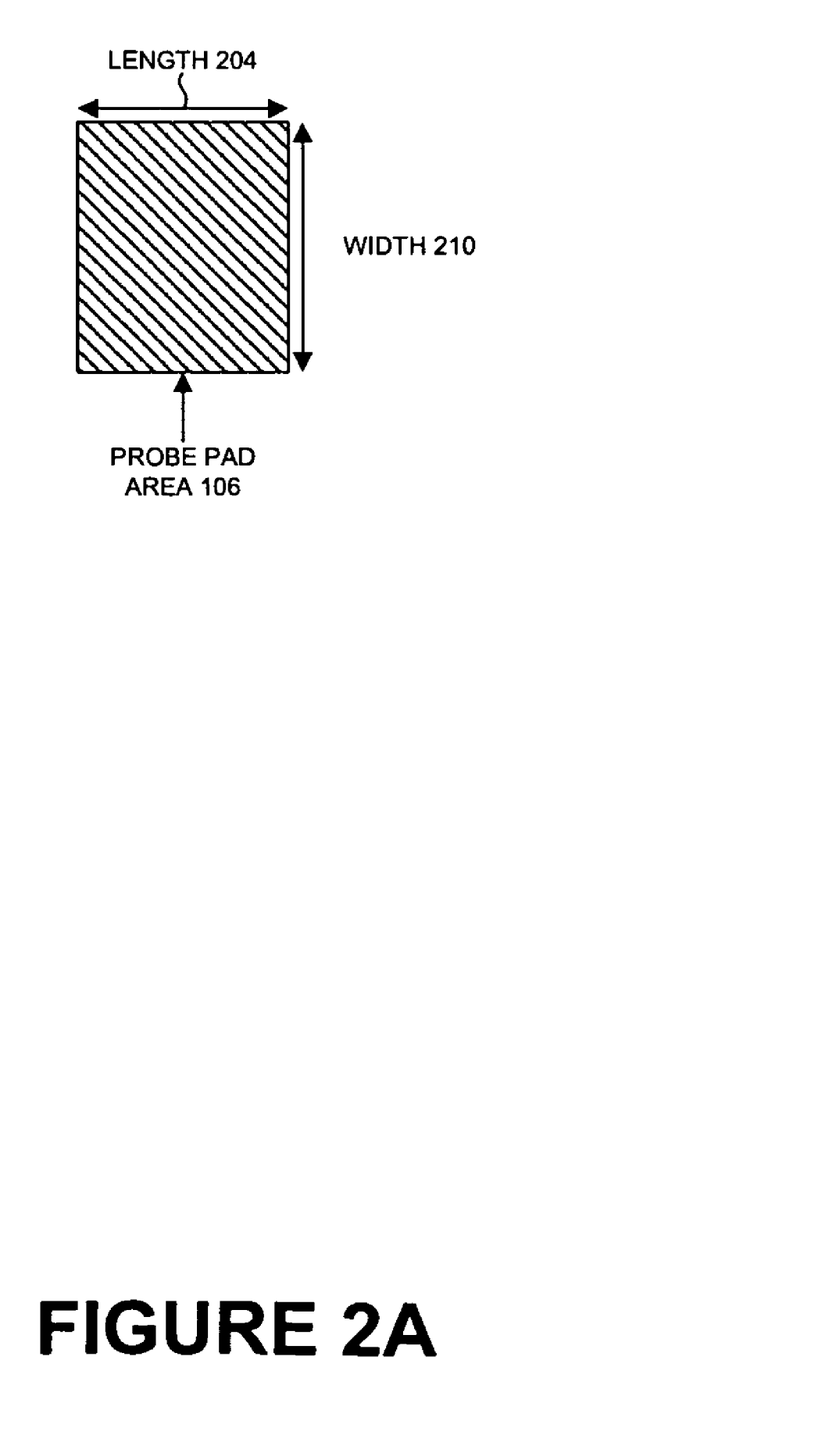
FIG. 2A, FIG. 2B and FIG. 2C are graphical views illustrating the coupling and dimension of probe pad area and bond pad area with a die metal interconnect, according to one embodiment.
Figure 2B:
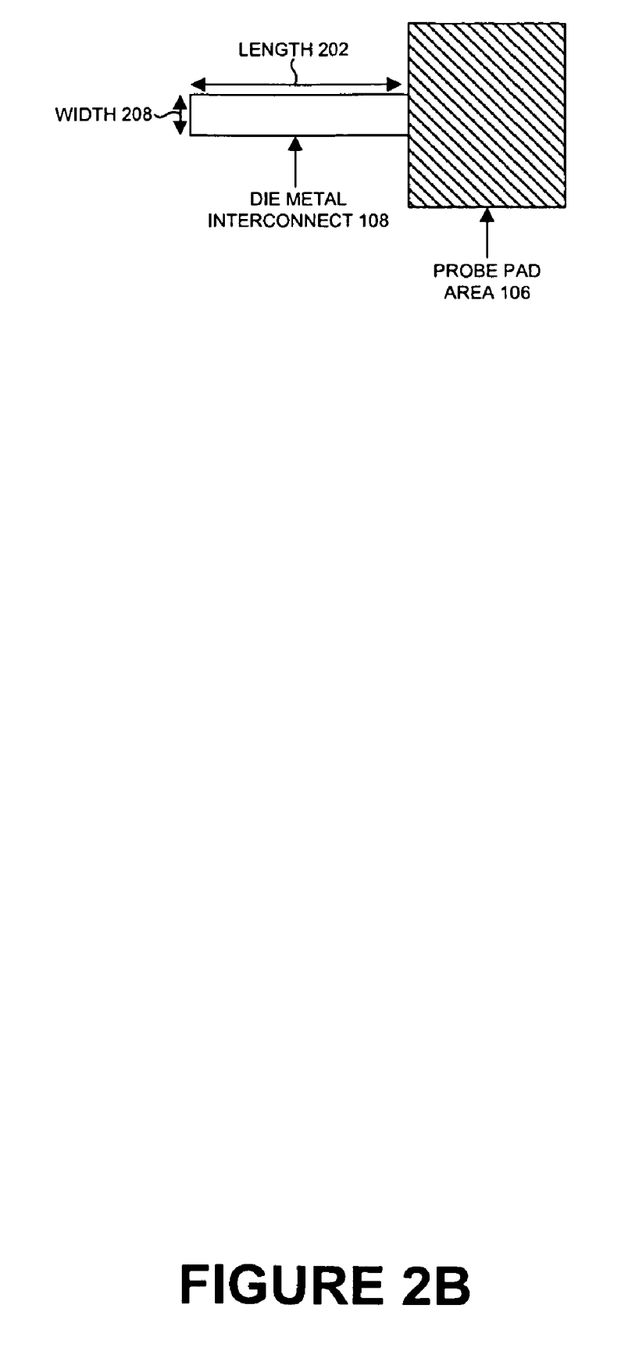
Figure 2C:
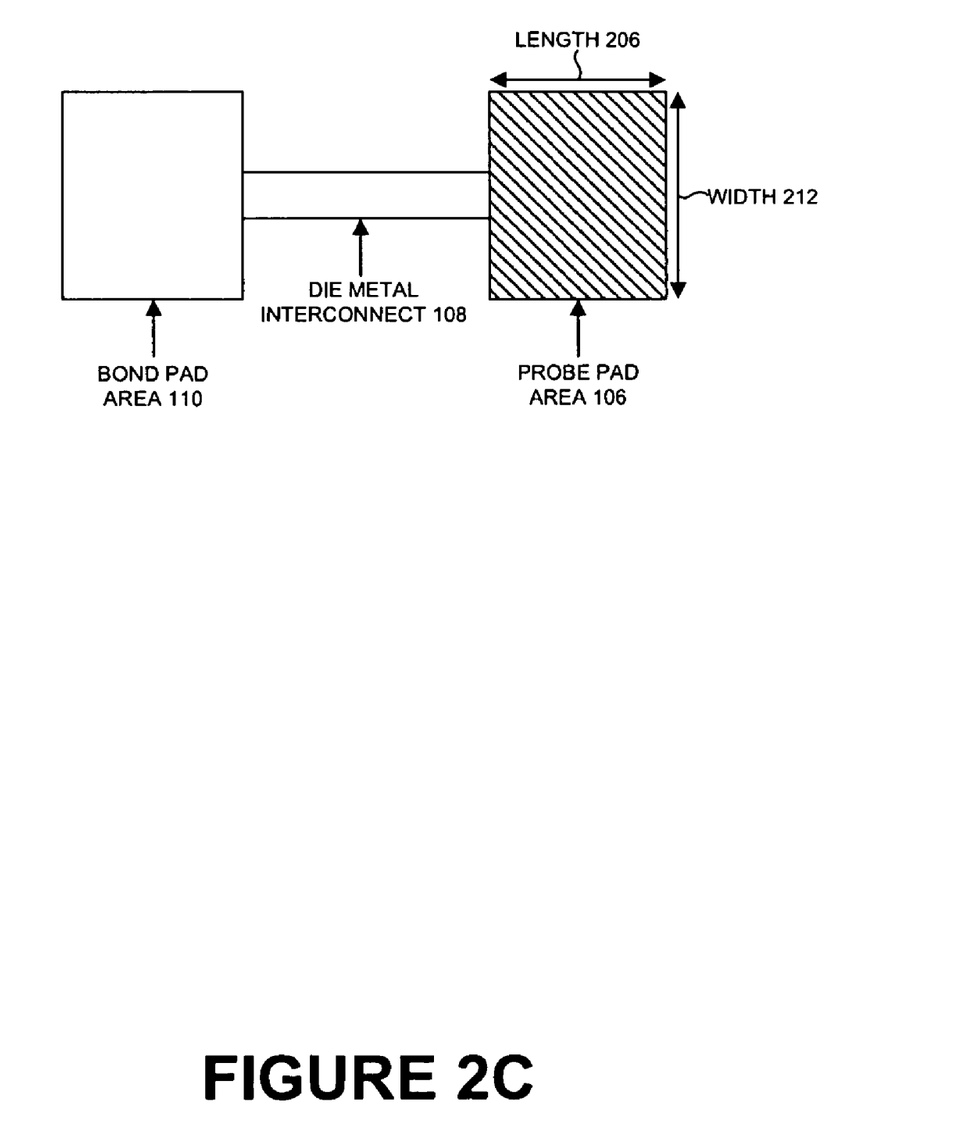

FIG. 2A, FIG. 2B and FIG. 2C are graphical views illustrating the coupling and dimension of probe pad area and bond pad area with a die metal interconnect, according to one embodiment. In particular, FIG. 2A illustrates a probe pad area 106, a length 204 and a width 210. FIG. 2B illustrates a die metal interconnect 108, a length 202, a width 208 and a probe pad area 106. Also, FIG. 2C illustrates a bond pad area 110, a probe pad area 106, a die metal interconnect 108, a length 206 and a width 212.

A probe pad area 106 may have a length 204 and a width 210. In an example embodiment, a boundary between the probe pad area 106 and the bond pad area 110 may be formed parallel to a scribe line of the semiconductor device with a die metal interconnect 108 as shown in FIG. 2A. The die metal interconnect 108 may have a length 202 and a width 208 as shown in FIG. 2B. Further, the probe pad area 106 has a length 206 and width 212 as shown in FIG. 2C. The die metal interconnect 108 may have a length 202 that is greater than any of the bond pad area length 206 and the probe pad area length 204. In FIG. 2C, a size of the probe pad area 106 may be substantially equal to a size of the bond pad area 106. The die metal interconnect 108 may have a width 208 that is less than any of the bond pad area width 212 and the probe pad area width 210.

The probe pad area 106 and the bond pad area 110 may be defined as are separate areas. Thus, probing of the pad may be performed on the probe pad area 106 and wire bonding is connected assembly is done onto the separate bonding area. Since the bonding area is not probed, the bonding area does not have damage from probing. Thus, the wire bonding quality is not degraded from probing during testing of the semiconductor device. By having such separate areas, probing and bonding any pad damage from probing during testing is limited to the probe pad area 106. Thus, the quality of wire bonding assembly onto the bond pad area 110 may not be compromised from such pad damage.

The pad may be formed into the probe pad area 106 and the bond pad area 110. The probe pad area 106 may be for the area onto which a probe tip of a tester is connected during testing of the IC such as for an electrical die sorting (EDS) process. The pads may provide external connection to nodes of the IC. For example, probe tips of a tester may be connected to the pads for testing the IC. In addition, gold wires or solder balls may be connected to the pads during assembly of a semiconductor package including the semiconductor device. After fabrication of the semiconductor device, an electrical die sorting (EDS) process may be performed for testing the functionality of the semiconductor device. A probe tip may be placed onto the pad of the semiconductor device for transmitting a test signal between a tester and the integrated circuit. However, such a probe tip may damage the pad as the probe tip is placed down onto the pad several times.

Figure 3:
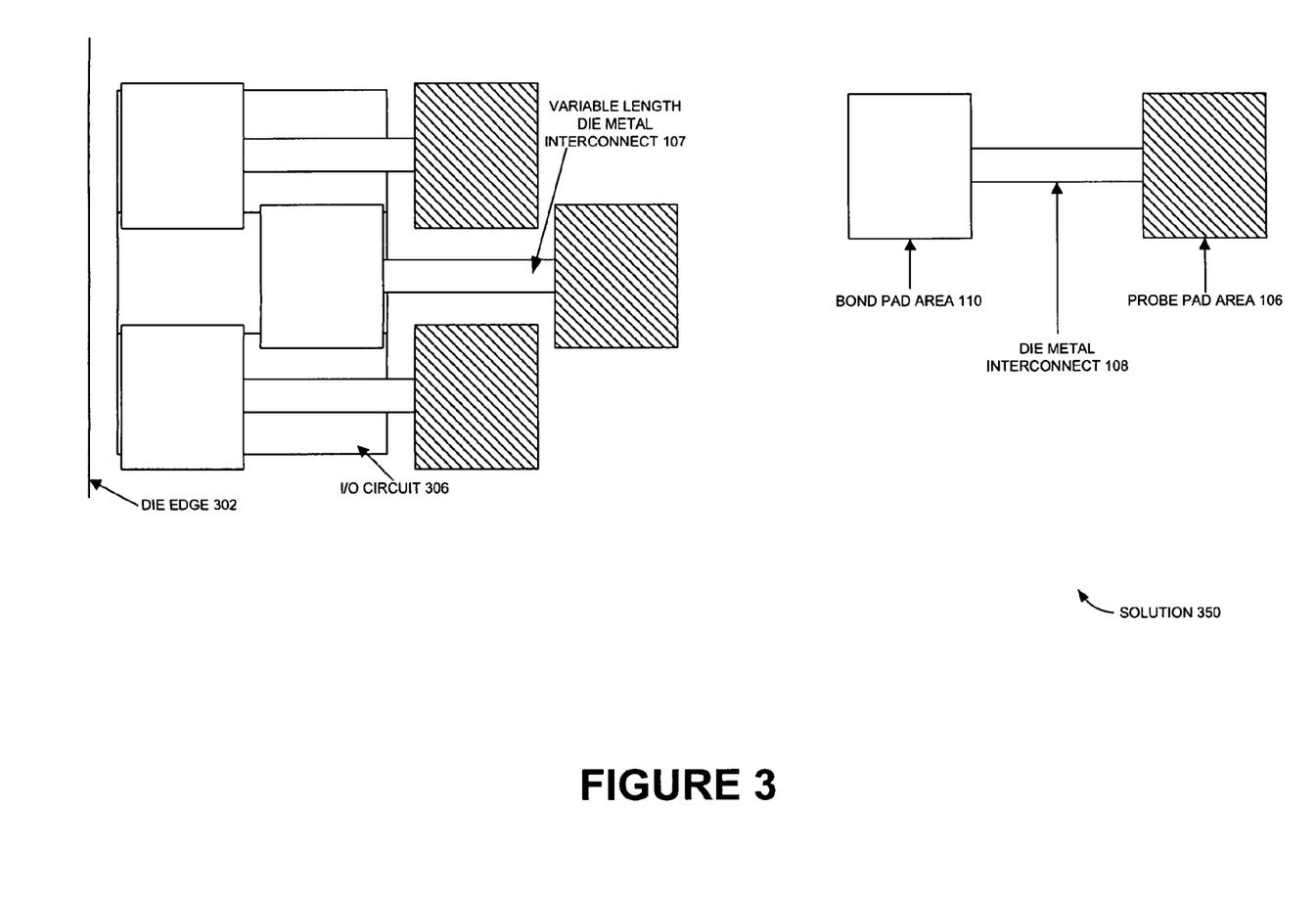
FIG. 3 is an exploded view of FIG. 1, according to one embodiment.

FIG. 3 is an exploded view of FIG. 1, according to one embodiment. In particular, FIG. 3 illustrates a die edge 302, an I/O circuit 306, a bond pad area 110, a probe pad area 106 and a variable length die metal interconnect 108.

Along a die edge 302 of the semiconductor substrate various I/O devices or cells may reside within an I/O circuit 306. In a wire-bond IC chip, each such I/O device may have at least one metal bond pad area 110 which is used as an electrical connection for an I/O signal. The wire-bond IC die may then be mounted within a plastic or ceramic package having multiple pins, and wire connections are made between the die's bonding pads and the package's pins. Finally, the package containing the IC die may be mounted onto a printed circuit board in a manner so as to form electrical connections between the pins of the IC and other components on the printed circuit board. In this manner, external signals can be provided to and from the IC die.

The variable length die metal interconnect 107 may be sized based on the circuit design requirements and/or topology of the circuit. The variable length die metal interconnect 107 may reduce the cost of assembly of the IC by separating the bond pad area 110 from the probe pad area 106. Basically, the variable length die metal interconnect 107 can be different based on the circuit design requirements and/or topology of the circuit.

The term I/O limited IC may refer to an IC having a large I/O count but small core logic count such that the die size is a direct function of the I/O count. In other words, increasing the I/O count may increase the die size. I/O limited designs may use two or more bond pad rows to support the high I/O count in a staggered fashion. The use of multiple bond pad rows places I/O devices farther towards the die center. This may reduce the available core region. However, since the design is I/O limited, a reduction in the usable core region may be acceptable as there is ample surface area for the space requirements of the core region. The term pad limited IC may be used interchangeably with the term I/O limited IC.

The core limited may refer to an IC having a smaller I/O count but larger core logic count such that the die size is a direct function of the core logic. The core logic, standard non-I/O devices, and macros for the IC may be formed within core region. The core region of ASIC or ASSP 102 may be surrounded by I/O region 104. For example, the I/O region 104 may be arranged adjacent to all four outer lateral edges of the core region of ASIC or ASSP 102. The bond pads may be arranged in a single row to allow a larger core region. The IC layout may include more than one row of bonding pads.

The I/O region 104 in this example may include I/O cells. The I/O devices in the I/O cells may be coupled to the bond pads by pad wires. In addition, I/O devices in the I/O cells may be coupled to core logic in the core region by signal traces. I/O cells may have a length (e.g., a lateral dimension of the I/O cells in a direction substantially parallel to the outer lateral die edge 302 closest to I/O cells) approximately equal to a length of bonding pads (e.g., a lateral dimension in the same direction defined above). Other and/or Filler cells may be placed between adjacent I/O cells. In this manner, every other cell in I/O region 104 may be an I/O cell, with filler cells placed between the I/O cells.

Therefore, the I/O cells may be spaced apart by approximately the same distance by which the bond pads are spaced apart. The space between the bonding pads may be set as the minimum distance allowable by other design constraints of the IC such as the bonding requirements specified by the packaging elements and packaging processes. In this manner, the distance between the bonding pads may be different for different technologies. For example, a flip chip IC may tend to have different criteria for the minimum spacing between adjacent bonding pads than a wire bonded IC. In this manner, the filler cells may be used to occupy the space between the I/O cells. The space on the die that is occupied by the filler cell is however, wasted silicon area. As such, it may be desirable to eliminate the other and/or filler cells to reduce the die size and/or the die cost.

Figure 4A:
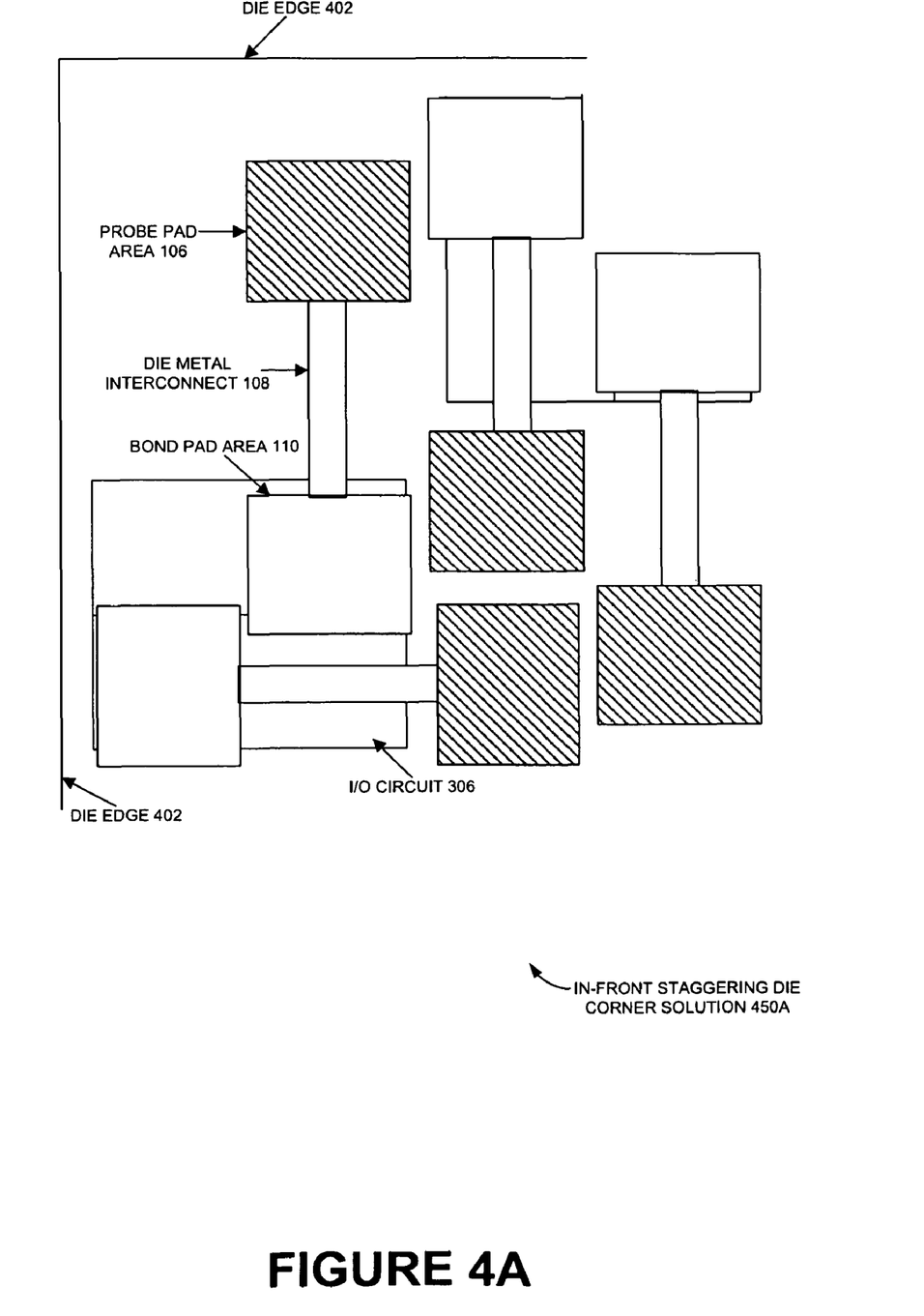
FIG. 4A and FIG. 4B are schematic diagrams illustrating different contrasting embodiments around a die corner, according to one embodiment.
Figure 4B:
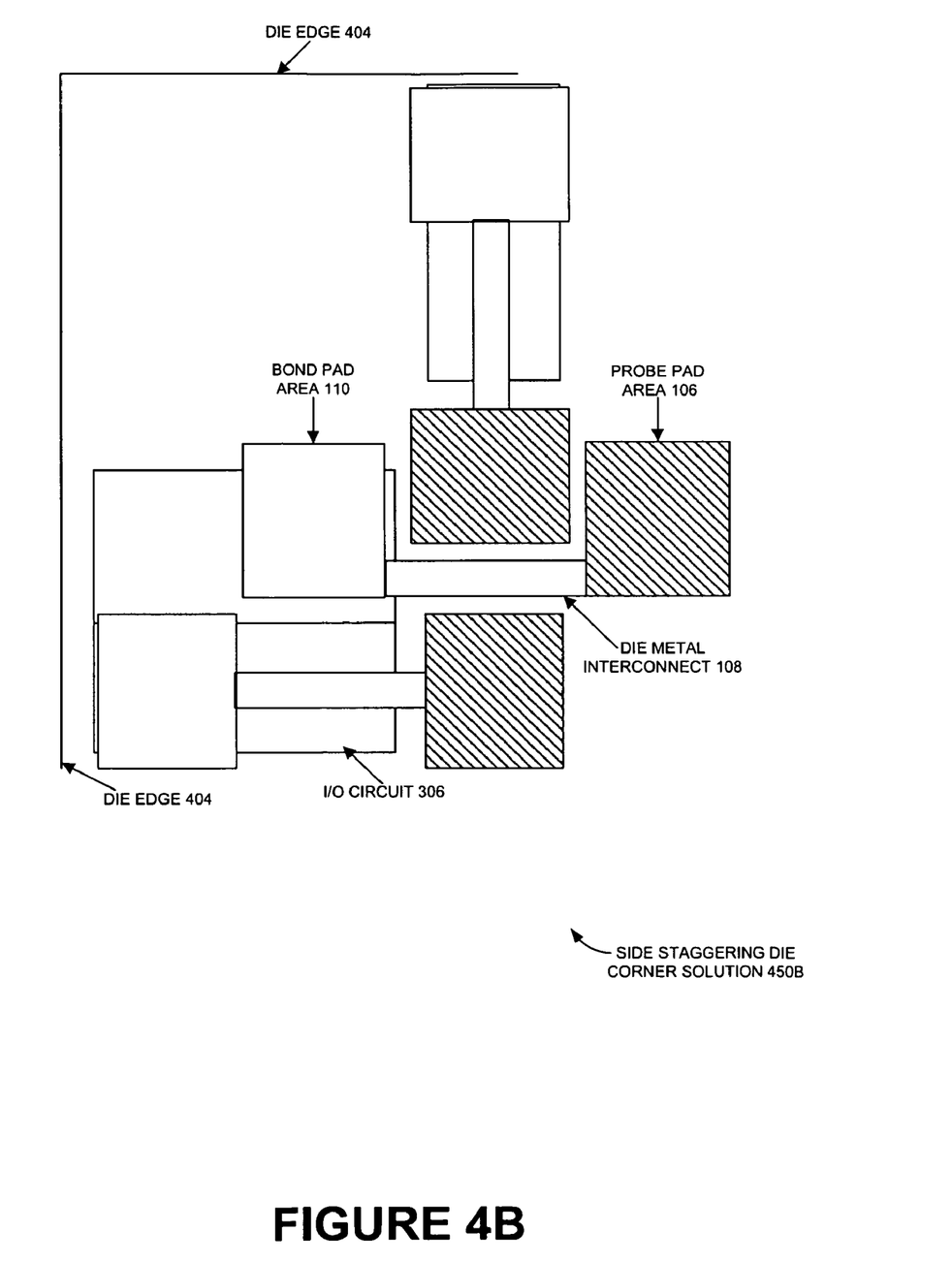

FIG. 4A and FIG. 4B are schematic diagrams illustrating different contrasting embodiments around a die corner, according to one embodiment. In particular, FIG. 4A illustrates an in front staggering die corner solution 450A and FIG. 4B illustrates a side staggering die corner solution 450B.

In an example embodiment, pads may be staggered in at least two different rows, and the minimum pad spacing criteria also includes a required minimum distance between the closest edges of the current pad and the wire corresponding to the subsequent pad in a higher row than that of the current pad. This aspect of the invention often can provide additional protection against fabrication problems.

The pad design may be in-line, meaning that all pads may be placed in the same row. Alternatively, the pad design may be staggered, meaning that pads are placed in different rows, preferably in a pre-defined pattern.

For in-line designs, the immediate-neighbor pad spacing requirement may specify that the current pad and the next pad satisfy minimum pad pitch and minimum pad-to-pad spacing criteria. These criteria are illustrated in FIG. 4A and FIG. 4B which shows a current I/O circuit 306 and the bond pad area 110, and a next I/O circuit 306 and the bond pad area 110. As shown in FIG. 4A, pad pitch (i.e., center-to-center spacing) between neighboring pads must be greater than a predetermined minimum distance. In addition, pad-to-pad spacing (i.e., between the closest edges of the pads) between the current pad and the next pad must be greater than a predetermined minimum distance.

Preferably, minimum pad pitch and minimum pad-to-pad spacing may be obtained from a library based on the particular technology used, an average pad pitch specified by the user, and the pad design used. As noted above, the relative lower-left and upper-right corners of the current I/O circuit 306 and bond pad area 110 in FIG. 4A, as well as the relative lower-left and upper-right corners of the next I/O circuit 306 and bond pad area 110 in FIG. 4B may be known. It is therefore a simple matter to mathematically convert each of the minimum pad pitch and minimum pad-to-pad spacing criteria into two corresponding minimum spacing between current I/O circuit 306 and its immediate-neighbor I/O circuit 306.

For staggered designs, the immediate-neighbor pad spacing requirement may specify that the spacing between the closest edges of the current pad and the wire connecting the next pad to the next I/O circuit 306 will be greater than a predetermined distance, (i.e., minimum pad-to-metal spacing). However, this pad spacing criterion may be applied only if the row number of the current pad is less than the row number for the next pad, where higher numbered rows are closer to the edge of the IC die edge 402 than lower numbered rows. The alternate configuration may be better understood from FIG. 5 with multiple I/O row solution 550.

Figure 5:
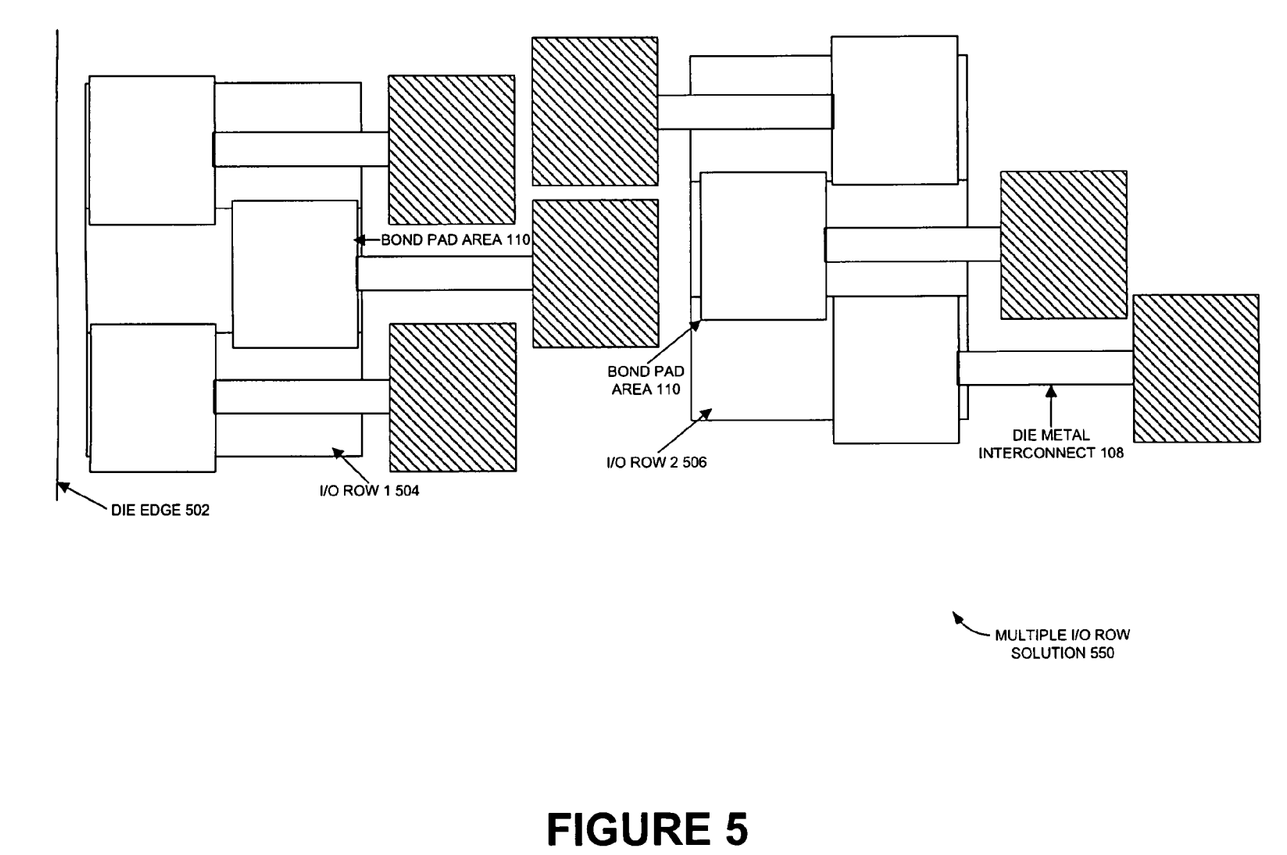
FIG. 5 is an exemplary embodiment in a type of die having multiple I/O rows separated by the core region, according to one embodiment.

FIG. 5 is an exemplary embodiment in a type of die having multiple I/O rows separated by the core region, according to one embodiment. In particular, FIG. 5 illustrates multiple I/O row solution 550 with respect to an I/O row 1 504, an I/O row 2 506 and a die edge 502.

In an example embodiment a portion of a die having an in-line arrangement of bond pad area 110 is illustrated. In an in-line arrangement, the bond pad area 110 may be located along the die edge 502 in a single row. Spacing of the bond pad area 110 may be described in terms of a pad pitch, or the center-to-center spacing of the pads. For example, pad pitch of the bond pad area 110, may be, for example, 75 microns. In some other dice, especially high-density dice, the bond pad area 110 may be arranged in a staggered arrangement resulting in multiple rows of bond pad area 110 located at die edge 502. Staggering the bond pad area 110 may permit more bond pads to be located on the die over that of an in-line arrangement. The location of a bond pad interior to the die, e.g., an inner bond pad, relative to the bond pads nearest to the die edge 502, e.g., outer bond pads, may be described as being "perfectly" staggered or "non-perfectly" staggered.

A portion of a die having staggered bond pads in a "perfect" staggered arrangement is illustrated in FIG. 5. The inner bond pad area 110 may be staggered relative to the outer bond pad area 110 in that they are located interior to the die edge 502 from the outer bond pad area 110 and are not "in-line" with the outer bond pad area 110. In this example, the inner bond pad area 110 are arranged in a "perfect" staggered arrangement relative to the outer bond pad area 110 as they are located interior to and directly between the outer bond pad area 110, i.e., in the spaces. Although the pad pitch between the outer bond pad area 110 may be the same as in the in-line arrangement earlier described e.g., 75 microns, the stagger of the additional row of inner bond pad area 110 may result in an smaller overall effective pad pitch, for example, 45 microns. Thus, a greater density of bond pads may be located on the same size die with a staggered arrangement of bond pad area 110 over that of a die having an in-line arrangement of bond pads.

In case of a portion of a die having staggered bond pads in a "non-perfect" staggered arrangement. The inner bond pad area 110 of the die edge 502 are not located directly between the outer bond pad area 110, but are horizontally offset relative to the outer bond pad area 110 so that, with increasing offset from the space between the outer bond pad area 110, portions of the bond pad area 110 become located behind the outer bond pad area 110. The offset may be to such a large degree that an inner bond pad area 110 is directly aligned behind a bond pad area 110.

As a staggered bond pad arrangement on a die provides greater bond pad density over that of most similarly sized die having in-line die arrangements, high-density dies are increasingly being designed with staggered bond pad arrangements. A design consideration, however, with the staggered arrangement is the possibility of wire crossing and shorting between bonding wires exiting from the inner bond pad area 110 with those bonding wires exiting from the outer bond pad area 110 when the die is attached to another substrate, such as a package substrate.

Figure 6:
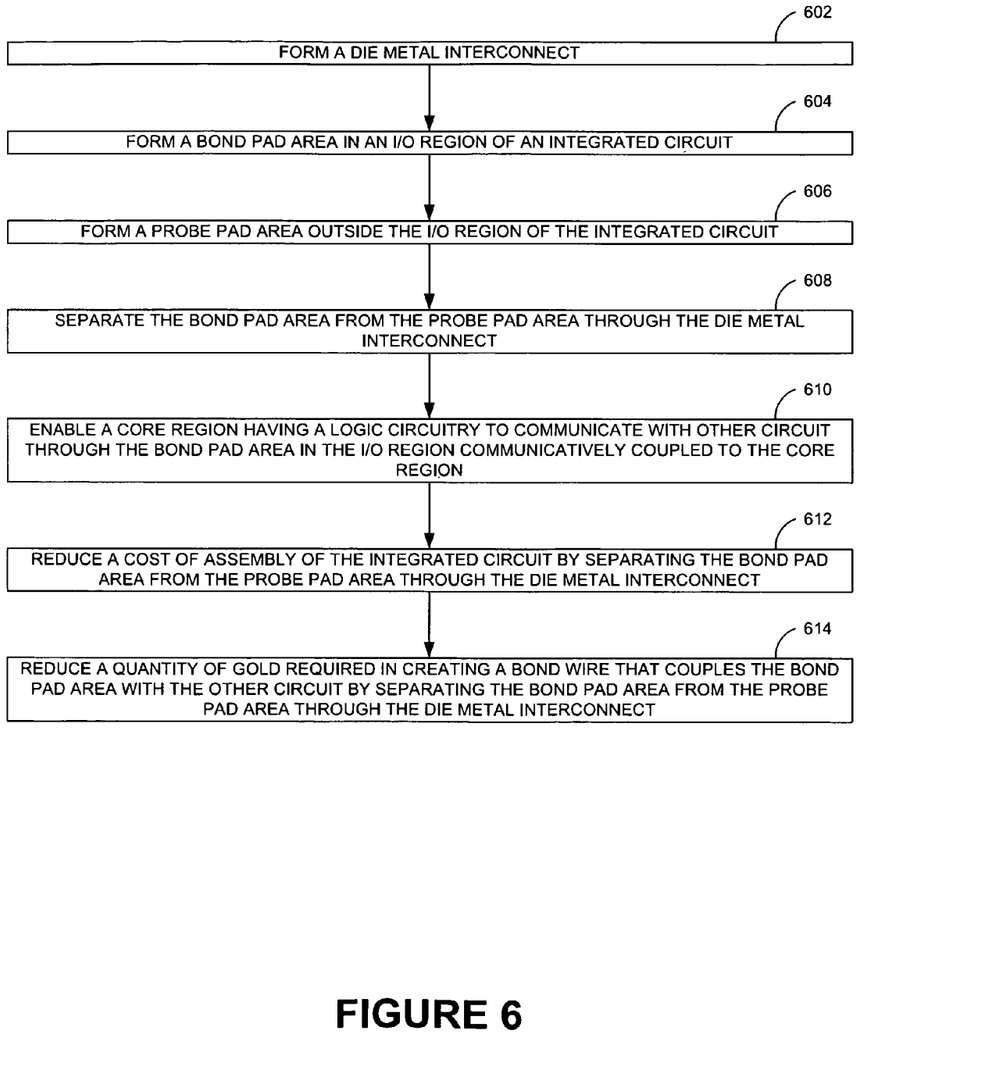
FIG. 6 is a process flow illustrating formation and reduction in cost of an IC, according to one embodiment.

FIG. 6 is a process flow illustrating formation and reduction in cost of an Integrated circuit (IC), according to one embodiment. In operation 602, a die metal interconnect 108 may be formed. In operation 604, a bond pad area 110 in an I/O region 104 of an IC may be formed. In operation 606, a probe pad area 106 outside the I/O region 104 of the IC may be formed. In operation 608, the bond pad area 110 from the probe pad area 106 through the die metal interconnect 108 may be separated. In operation 610, a core region having a logic circuitry to communicate with the other circuit through the bond pad area 110 in the I/O region 104 adjacent to the core region may be enabled. In operation 612, a cost of assembly of the integrated circuit by separating the bond pad area 110 from the probe pad area 106 through the die metal interconnect 108 may be reduced. In operation 614, a quantity of gold required in creating a bond wire that couples the bond pad area 110 with the other circuit by separating the bond pad area 110 from the probe pad area 106 through the die metal interconnect 108 may be reduced.

Figure 7:
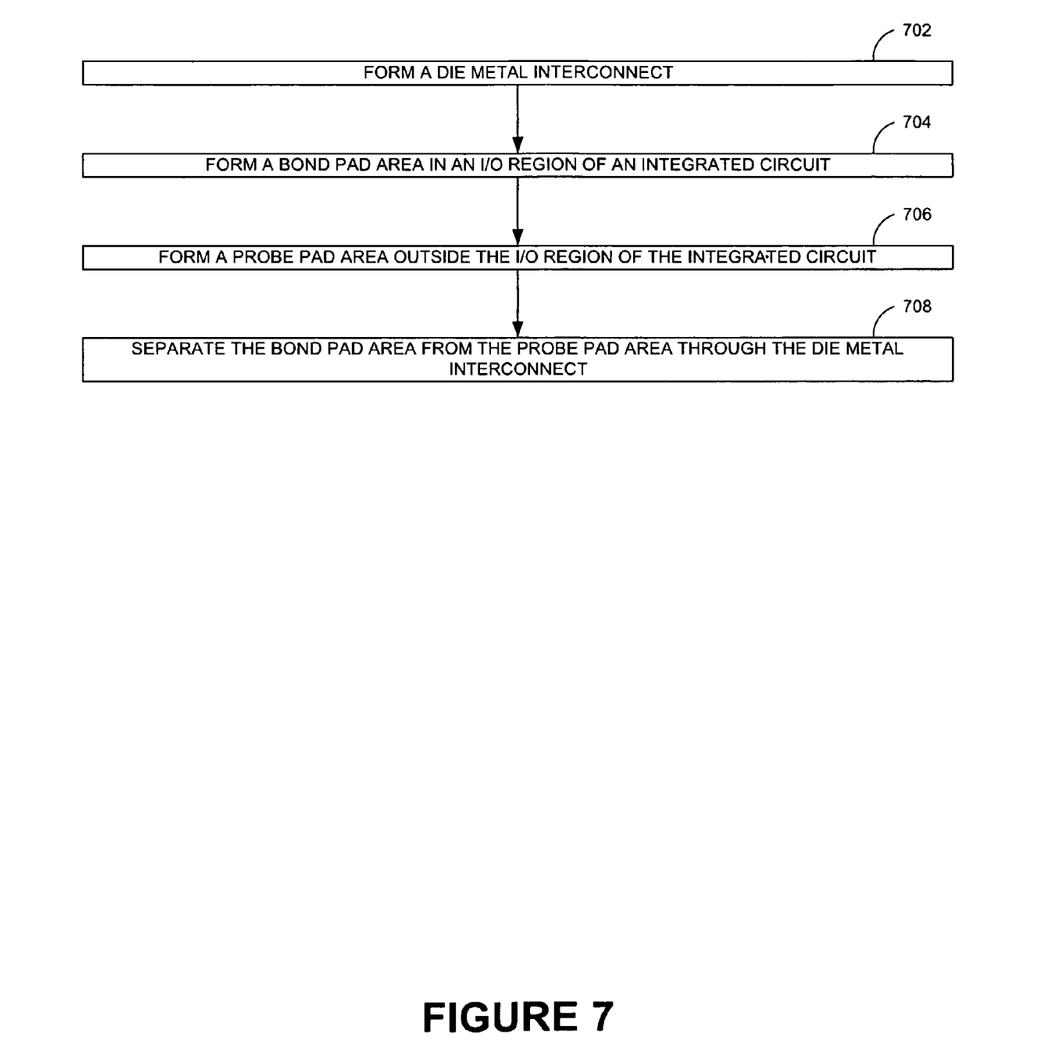
FIG. 7 is a process flow illustrating formation and separation of probe pad area and bond pad area of an IC, according to one embodiment.

FIG. 7 is a process flow illustrating formation and separation of probe pad area and bond pad area of an IC, according to one embodiment. In operation 702, a die metal interconnect 108 may be formed. In operation 704, a bond pad area 110 in an I/O region 104 of an integrated circuit may be formed. In operation 706, a probe pad area 106 outside the I/O region (or, inside the core region) of the integrated circuit may be formed. In operation 708, the bond pad area 110 from the probe pad area 106 through the die metal interconnect 108 may be separated.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium).

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. An integrated circuit comprising:
    a plurality of probe pads arranged in a staggered manner in a core region of the integrated circuit, the core region including logic circuitry therein;
    a plurality of bond pads in an Input/Output (I/O) region surrounding the core region, the I/O region being configured to enable the core region to communicate with at least one external circuit through the plurality of bond pads; and
    a die metal interconnect separating a bond pad area in the I/O region from a probe pad area in the core region,
    wherein at least one of a dimension of the die metal interconnect and a position of the die metal interconnect between the probe pad area and the bond pad area is variable, and
    wherein the die metal interconnect separating the bond pad area and the probe pad area is of a variable length based on the staggered positions of the plurality of bond pads in the I/O region and the staggered positions of the plurality of probe pads in the core region.

2. The integrated circuit of claim 1, wherein the plurality of bond pads at a die corner is arranged in an in-front staggering manner to maintain the bond pad area in the I/O region.

3. The integrated circuit of claim 1, wherein the plurality of bond pads is side-staggered at a die corner to maintain the bond pad area in the I/O region.

4. The integrated circuit of claim 1, wherein a pitch between adjacent bond pad areas is reduced in comparison to when the bond pad and the probe pad are in the same region.

5. The integrated circuit of claim 1, wherein the core region includes more number of logic circuits when compared to a core region of an integrated circuit having a non-staggered arrangement of the plurality of probe pads.

6. The integrated circuit of claim 1, wherein the bond pad area located in the I/O region is compactly staggered to provide greater bond pad density over in-line pad arrangements.

7. A method comprising:
    compactly staggering probe pads within a core region of an integrated circuit, the probe pads being configured to provide coupling between circuits of the core region and corresponding bond pads in an I/O region of the integrated circuit;
    conductively coupling the probe pads within the core region and the corresponding bond pads in the I/O region through die metal interconnects, at least one of a dimension of each die metal interconnect and a position of the each die metal interconnect between a corresponding probe pad and a bond pad being variable, and the each die metal interconnect being of a variable length based on the staggered position of the bond pad and the probe pad; and
    increasing a number of circuits within the core region of the integrated circuit based on the compact staggering of the probe pads within the core region of the integrated circuit.

8. The method of claim 7, further comprising reducing a quantity of gold required in creating bond wires that couple bond pad areas with at least one external circuit by separating bond pad areas from the probe pad areas through the die metal interconnects.

9. The method of claim 7, further comprising compactly staggering bond pads in the I/O region to utilize space therein efficiently.

10. The method of claim 7, further comprising reducing centre to centre pitch between adjacent bond pad areas, in comparison to when bond pad areas and probe pad areas are in the same region.

11. The method of claim 9, comprising utilizing an in-front staggering technique at a die corner of the integrated circuit to maintain bond pad areas in the I/O region.

12. The method of claim 7, comprising utilizing a side staggering technique at a die corner of the integrated circuit to maintain bond pad areas in the I/O region.

13. The method of claim 7, further comprising staggering bond pad areas located in the I/O region to provide greater bond pad density over in-line pad arrangements.

14. The method of claim 9, further comprising increasing a number of external circuits to be interfaced with the integrated circuit through the compact staggering of bond pads in the I/O region.

15. A system comprising;
    an integrated circuit comprising:
        a plurality of probe pads arranged in a staggered manner in a core region, the core region including logic circuitry therein;
        a plurality of bond pads in an I/O region surrounding the core region; and a die metal interconnect separating a bond pad area in the I/O region from a probe pad area in the core region, at least one of a dimension of the die metal interconnect and a position of the die metal interconnect between the probe pad area and the bond pad area being variable, and the die metal interconnect being of a variable length based on the staggered positions of the plurality of bond pads in the I/O region and the staggered positions of the plurality of probe pads in the core region; and an external circuit electrically interfaced with the integrated circuit through the plurality of bond pads in the I/O region of the integrated circuit.

16. The system of claim 15, wherein the plurality of bond pads in the I/O region of the integrated circuit is arranged in a staggered manner.

17. The system of claim 15, wherein the external circuit also possesses structure and functionality analogous to the integrated circuit.

18. The system of claim 15, wherein a pitch between adjacent bond pad areas of the integrated circuit is reduced in comparison to when the bond pad and the probe pad are in the same region.

19. The system of claim 15, wherein the core region of the integrated circuit includes more number of logic circuits when compared to a core region of an integrated circuit having a non-staggered arrangement of the plurality of probe pads.

20. The system of claim 16, wherein the plurality of bond pads in the I/O region of the integrated circuit is arranged in an in-front staggering manner at a die corner thereof to maintain the bond pad area in the I/O region.

* * * * *